(12) United States Patent
Ko

(10) Patent No.: US 7,684,260 B2
(45) Date of Patent: Mar. 23, 2010

(54) FLASH MEMORY DEVICE AND METHOD FOR DRIVING THE SAME

(75) Inventor: Bok-Rim Ko, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 254 days.

(21) Appl. No.: 11/967,559

(22) Filed: Dec. 31, 2007

(65) Prior Publication Data

US 2008/0239832 A1 Oct. 2, 2008

(30) Foreign Application Priority Data

Mar. 29, 2007 (KR) .................. 10-2007-0030769

(51) Int. Cl.
*G11C 7/10* (2006.01)
(52) U.S. Cl. ............ 365/189.05; 365/194; 365/189.011
(58) Field of Classification Search ............ 365/189.05, 365/194, 189.011
See application file for complete search history.

(56) References Cited

U.S. PATENT DOCUMENTS

| 5,212,442 A | 5/1993 | O'Toole et al. |
| 5,930,172 A * | 7/1999 | Kucera .................. 365/185.21 |
| 6,282,679 B1 | 8/2001 | Lee et al. |
| 2003/0235090 A1 | 12/2003 | Lee et al. |
| 2006/0220257 A1 | 10/2006 | Lee |

FOREIGN PATENT DOCUMENTS

| JP | 08-079046 | 3/1996 |
| JP | 11-287774 | 10/1999 |
| KR | 1998-0058191 | 9/1998 |
| KR | 1998-0083434 | 12/1998 |
| KR | 2000-0033541 | 6/2000 |
| KR | 2003-0084493 | 11/2003 |

* cited by examiner

*Primary Examiner*—Son Dinh
*Assistant Examiner*—Nam Nguyen
(74) *Attorney, Agent, or Firm*—IP & T Law Firm PLC

(57) ABSTRACT

A flash memory device includes a data input/output pad and a core region in which a plurality of unit cells are arranged. A data input buffer is configured to receive command and address data through the data input/output pad and transfer the received command and address to the core region. A data output buffer is configured to output the data through the data input/output pad, and a data input controller is configured to detect an outputting of the data and disable the data input buffer.

15 Claims, 5 Drawing Sheets

FLASH MEMORY DEVICE AND METHOD
FOR DRIVING THE SAME

CROSS-REFERENCE TO RELATED APPLICATIONS

The present application claims priority of Korean patent application number 10-2007-0030769, filed on Mar. 29, 2007, which is incorporated by reference in its entirety.

BACKGROUND OF THE INVENTION

The present invention relates to a semiconductor memory device, and more particularly, to a data input buffer of a flash memory device.

Semiconductor memory devices are used for storing data. The semiconductor memory devices may be classified by various criteria. As one example, semiconductor memory devices are classified into volatile memory devices and nonvolatile memory devices according to whether they retain data even when power is interrupted. The volatile memory devices retain data when power is being supplied, but their stored data disappear when power is interrupted. Examples of the volatile memory devices include dynamic random access memory (DRAM) and static random access memory (SRAM). On the other hand, the nonvolatile memory devices retain data even when power is interrupted. Examples of the nonvolatile memory devices include mask erasable programmable read-only memory (EPROM), electrically erasable programmable read-only memory (EEPROM), and flash memory devices. As portability of electronic devices is emphasized, the use of nonvolatile memory devices is further increasing. In particular, flash memory devices among the nonvolatile memory devices are widely used because they can store and read data in a convenient way.

Flash memory devices are generally classified into NAND flash memory devices and NOR flash memory devices. In a NOR flash memory device, one MOS transistor is connected to a word line and a bit line as a unit storage element. Like in a general DRAM, a plurality of bit lines are disposed to cross a plurality of word lines, and a plurality of MOS transistors are disposed at crossing points between the bit lines and the word lines as unit storage elements. In a NAND flash memory device, a plurality of MOS transistors are serially connected to form one string as unit storage elements for high integration. That is, a drain of a MOS transistor is connected to a source of an adjacent MOS transistor. Therefore, the NOR flash memory device has a fast read/write speed, but is disadvantageous in high integration. On the other hand, the NAND flash memory device has a slow read/write speed, but is advantageous in high integration. In recent years, the demand for high-capacity portable memory devices has significantly increased.

A data storing operation of a flash memory device includes a program operation and an erase operation. The program operation is to change a threshold voltage of a MOS transistor used as a unit storage element of the flash memory device, and the erase operation is to restore the change threshold voltage of the MOS transistor. For example, the threshold voltages of the MOS transistors where data "1" will be stored are reduced to a predetermined level, and the threshold voltages of the MOS transistors where data "0" will be stored are maintained as they are.

FIG. 1 is a block diagram illustrating a read operation of a flash memory device. The flash memory device receives a command signal and an address and outputs data through one data input/output (I/O) pad.

Referring to FIG. 1, in the read operation, a read command and an address are sequentially inputted and then data is outputted. An I/O timing of the command, the address, and the data is controlled by control signals ALE, WEB, REB, CLE and R/BB. The command and the address inputted from the outside through one data I/O pad are stored in a data input buffer. The command and the address stored in the data input buffer are transferred to a core region. A data output buffer outputs the stored data through the data I/O pad through which the command and the address have been inputted. Therefore, the data input buffer is always in an enabled state while the read command for outputting the data to the outside is executed. This causes high power consumption in the flash memory device.

FIG. 2 is a block diagram of a conventional flash memory device.

Referring to FIG. 2, the conventional flash memory device includes a data output buffer 10, an input timing controller 20, a data input buffer 30, an electrostatic discharge (ESD) protector 40, and a data input controller 50.

The data output buffer 10 stores data DOUT and outputs the stored data DOUT through a data I/O pad DQ to the outside. The ESD protector 40 protects internal circuits, e.g., the data input buffer 30 and the input timing controller 20, from electrostatic discharge inputted through the data I/O pad DQ. The data input buffer 30 latches data, address, command transferred through the data I/O pad DQ and transfers them to the input timing controller 20 in response to an enable signal EN. The data input controller 50 generates the enable signal EN for controlling an enable timing of the data input buffer 30 in response to control signals STDBY and BYTE. The control signals STDBY and BYTE are activated in a standby mode. The data input controller 50 controls the data input buffer 30 to be disabled in the standby mode. The input timing controller 20 controls setup/hold timing of data, address, and command outputted from the data input buffer 30 and transfers the controlled setup/hold timing to the core region.

FIG. 3 is a circuit diagram of the data input controller 50 illustrated in FIG. 2.

Referring to FIG. 3, the data input controller 50 includes a NAND gate ND1 configured to receive the control signals STDBY and BYTE, and inverters I1 and I2 serially connected to invert an output signal of the NAND gate ND1.

As described above, the data input buffer 30 of the conventional flash memory device is always in the turned-on state all the modes other than the standby mode. Therefore, the conventional flash memory device consumes a large amount of current while the read or write command is executed.

SUMMARY OF THE INVENTION

Embodiments of the invention are directed to providing a flash memory device that can effectively reduce unnecessary current consumption of a data output buffer in a data read operation.

In accordance with a first aspect of the invention, there is provided a flash memory device, including: a data input/output pad; a core region including a plurality of unit cells; a data input buffer configured to receive a command and an address through the pad and to transfer the command and address to the core region; a data output buffer configured to output data corresponding to the command through the pad; and a data input controller configured to detect an outputting of data corresponding to the command and the address, and to disable the data input buffer.

In accordance with a second aspect of the invention, there is provided a method for driving a flash memory device, including: receiving a command and an address through a data input/output pad and transferring the command and address; outputting data corresponding to the command through the data input/output pad; and detecting an outputting of the data corresponding to the command and the address, and disabling the data input buffer.

In accordance with a third aspect of the invention, there is provided a flash memory device, including: a data input/output pad; a data input buffer configured to receive a command and an address through the data input/output pad and to transfer the command and address to a core region; and a data input controller configured to detect an outputting of the data corresponding to the command and the address, and to disable the data input buffer.

In accordance with a fourth aspect of the invention, there is provided a flash memory device, including: a data input buffer configured to receive a command and an address through a data input/output pad and transfer the command and address to a core region; a data output buffer configured to output data corresponding to the command through the data input/output pad; and a data input controller configured to generate a data input enable signal to enable the data input buffer in response to a timing control signal to disable the data input buffer by detecting an outputting of the data corresponding to the command and the address.

DESCRIPTION OF SPECIFIC EMBODIMENTS

Hereinafter, a flash memory device and a method for driving the same in accordance with the invention will be described in detail with reference to the accompanying drawings.

Figure 1:
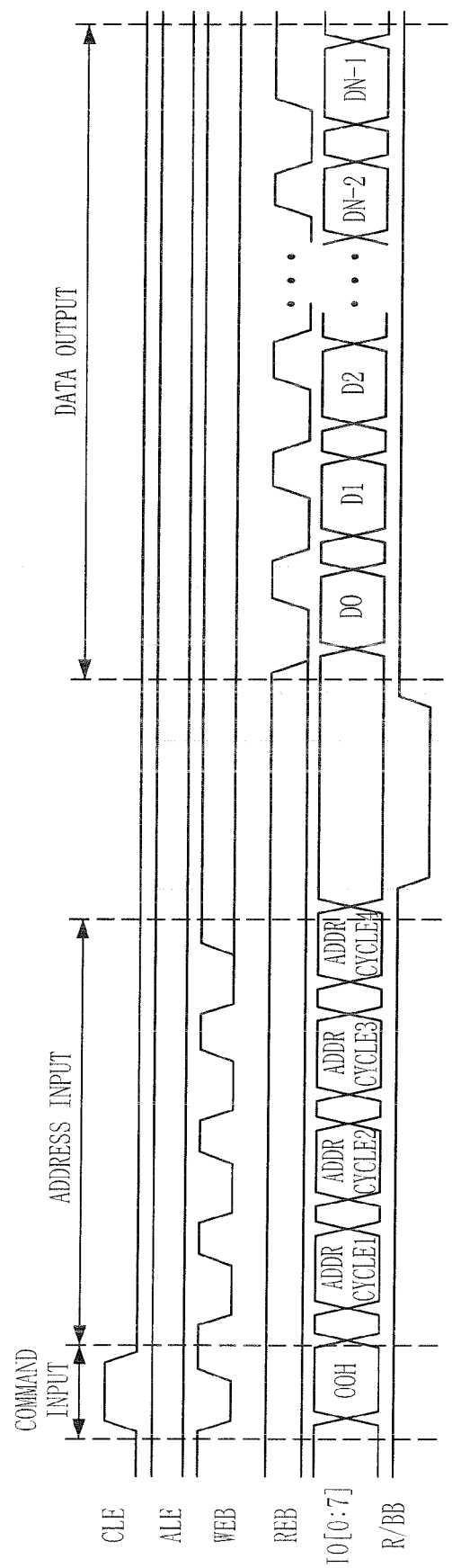
FIG. 1 is a timing diagram of a read operation for a flash memory device.
Figure 2:
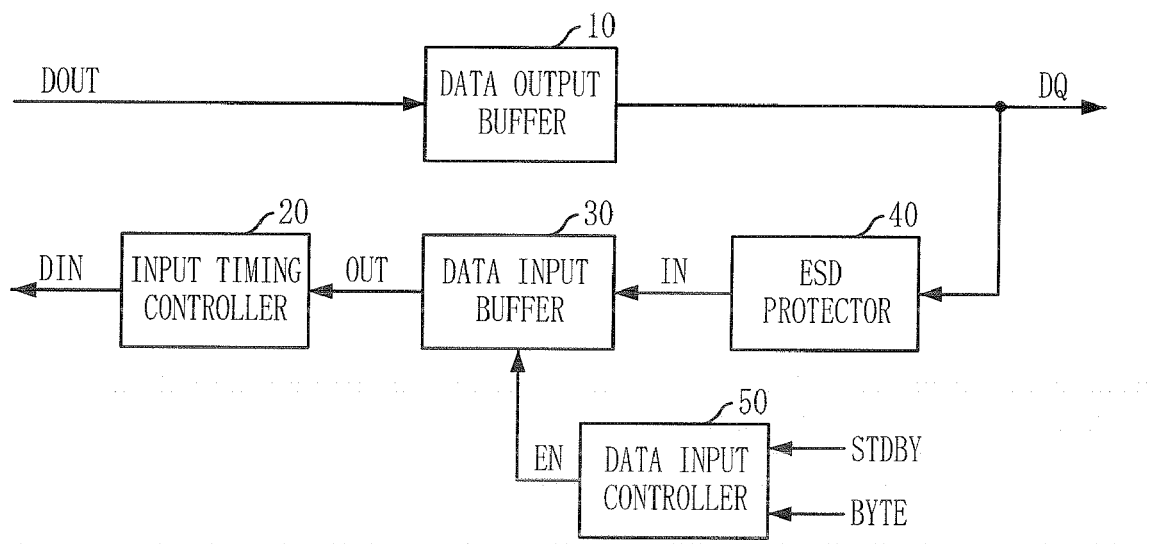
FIG. 2 is a block diagram of a conventional flash memory device.
Figure 3:
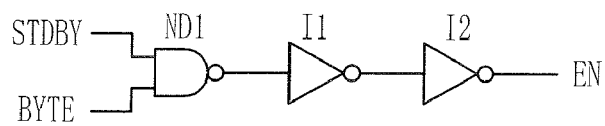
FIG. 3 is a circuit diagram of a data input controller as illustrated in FIG. 2.
Figure 4:
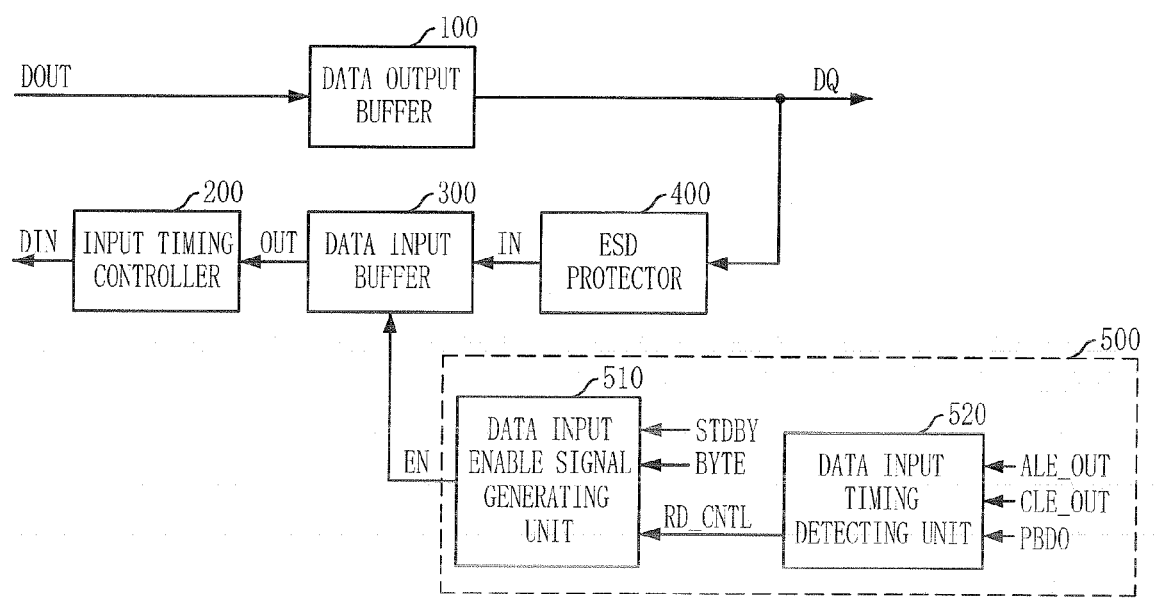
FIG. 4 is a block diagram of a flash memory device in accordance with an embodiment of the invention.

FIG. 4 is a block diagram of a flash memory device in accordance with an embodiment of the invention.

Referring to FIG. 4, the flash memory device includes a data output buffer 100, an input timing controller 200, a data input buffer 300, an ESD protector 400, and a data input controller 500. The data output buffer 100 stores data DOUT The data output buffer 100 stores data DOUT and outputs the stored data DOUT through a data I/O pad DQ to the outside. The ESD protector 400 protects internal circuits, e.g., the data input buffer 300 and the input timing controller 200, from electrostatic discharge inputted through the data I/O pad DQ. The data input buffer 300 latches data, address, command transferred through the data I/O pad DQ and transfers them to the input timing controller 200.

The data input controller 500 generates a data input enable signal EN for controlling an enable timing of the data input buffer 300 in response to control signals STDBY, BYTE, PBDO, ALE_OUT and CLE_OUT. The data input controller 500 includes a data input enable signal generating unit 510 and a data input timing detecting unit 520. The data input timing detecting unit 520 detects a timing after the signal inputted to the data input buffer 300 is transferred, and generates a timing control signal RD_CNTL for disabling the data input buffer 300. More specifically, the data input timing detecting unit 520 receives a buffered signal ALE_OUT of an address latch enable signal ALE, a buffered signal CLE_OUT of a command latch enable signal CLE, and a page buffer enable signal PBDO to generate the timing control signal RD_CNTL. The address latch enable signal ALE, the command latch enable signal CLE, and the page buffer enable signal PBDO are control signals inputted to the flash memory device.

The data input enable signal generating unit 510 receives the control signals STDBY and BYTE and the timing control signal RD_CNTL to generate the data input enable signal EN for controlling the enable timing of the data input buffer 300. The control signals STDBY and BYTE are activated in a standby mode.

The input timing controller 200 controls setup/hold timing of data, address, and command outputted from the data input buffer 300 and transfers the controlled setup/hold timing to the core region.

Figure 5:
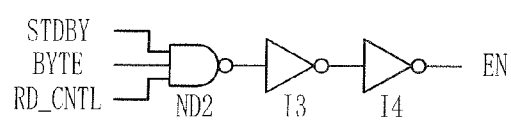
FIG. 5 is a circuit diagram of a data input enable signal generating unit as illustrated in FIG. 4.

FIG. 5 is a circuit diagram of the data input enable signal generating unit 510 illustrated in FIG. 4.

Referring to FIG. 5, the data input enable signal generating unit 510 includes a NAND gate ND2 configured to receive the control signals STDBY and BYTE and the timing control signal RD_CNTL, and inverters I3 and I4 serially connected to invert an output signal of the NAND gate ND2 to generate the data input enable signal EN.

Figure 6:
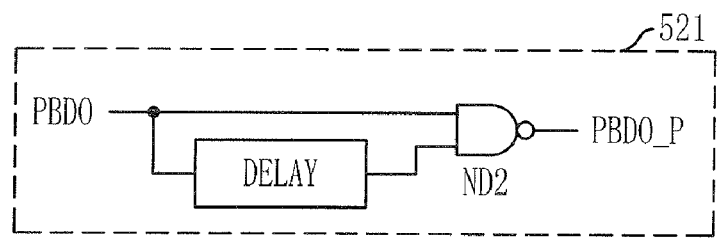
FIG. 6 is a circuit diagram of a data input timing detecting unit as illustrated in FIG. 4.
Figure 6:
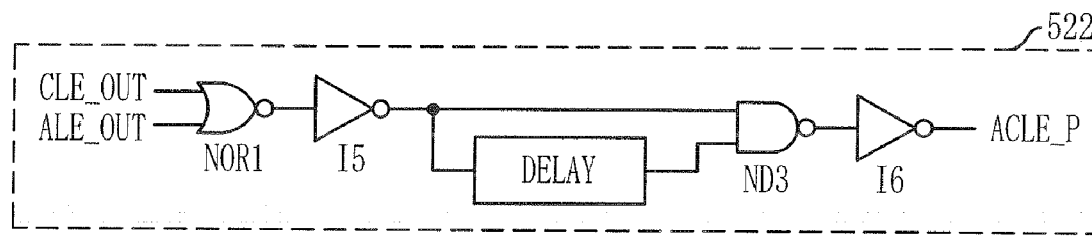
Figure 6:
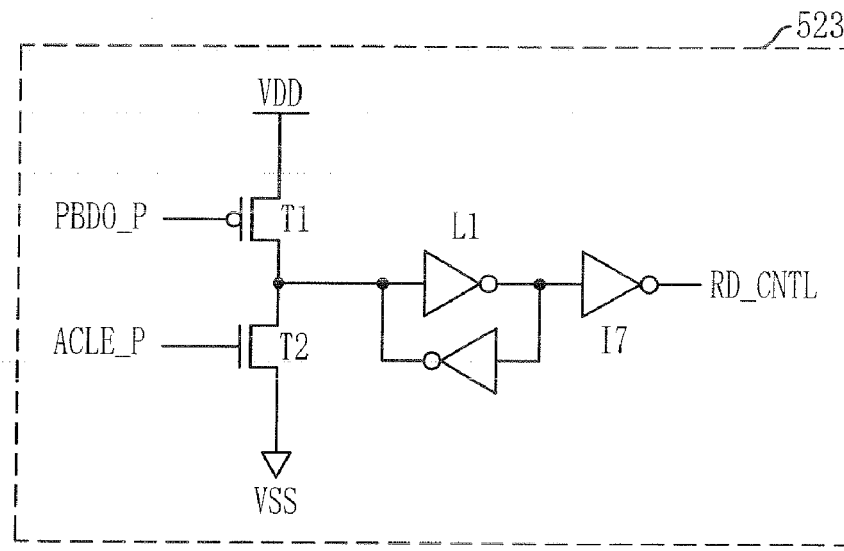

FIG. 6 is a circuit diagram of the data input timing detecting unit 520 illustrated in FIG. 4.

Referring to FIG. 6, the data input timing detecting unit 520 includes a first detecting unit 521, a second detecting unit 522, and a third detecting unit 523. The first detecting unit 521 detects the enabling of a page buffer to output a first detecting signal PBDO_P, and the second detecting unit 522 detects an address input and a command input to output a second detecting signal ACLE_P. The third detecting unit 523 combines the first detecting signal PBDO_P and the second detecting signal ACLE_P to generate the timing control signal RD_CNTL for controlling the enable timing of the data input buffer 300.

The first detecting unit 521 receives the page buffer enable signal PBDO for detecting the enabling of the page buffer. The page buffer is generally disposed in the flash memory device and buffers data provided from unit cells of the core region. Since it is apparent to those skilled in the art that the page buffer is provided in the flash memory device, its detailed description will be omitted.

Figure 7:
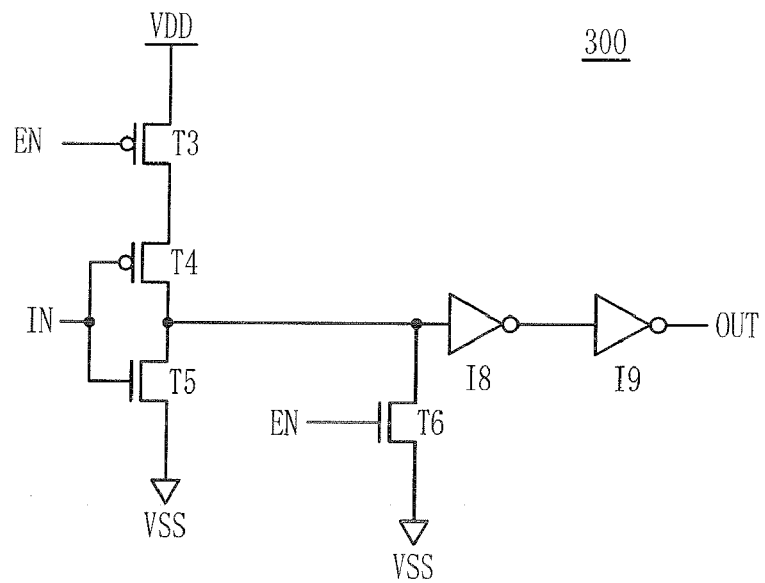
FIGS. 7 and 8 are circuit diagrams of a data input buffer as illustrated in FIG. 4.
Figure 8:
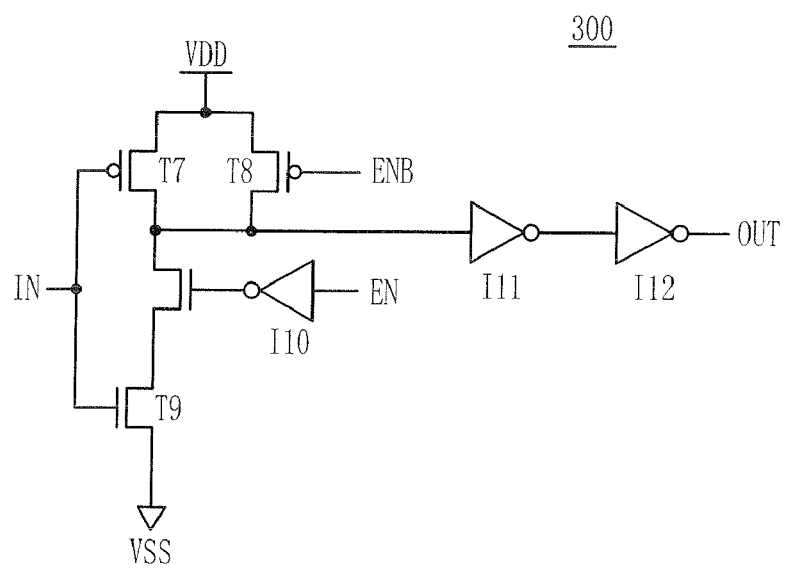

FIGS. 7 and 8 are circuit diagrams of the data input buffer 300 illustrated in FIG. 4.

The data input buffer 300 of FIG. 7 is enabled in response to the data input enable signal EN to buffer an input signal IN. The data input buffers of FIGS. 7 and 8 have different circuit configurations, but perform a substantially equal operation.

The flash memory device in accordance with the embodiments of the invention can effectively disable the operation of a part of the data input buffer in the read operation.

An essential principle is to detect a time point when the address latch enable signal ALE and the command latch enable signal CLE for detecting the address input and the command input change from a logic low level to a logic high level, generate a pulse signal of a logic high level from the detected time point, and enable the data input buffer 300 in response to the pulse signal. This operation is performed by the second detecting unit 522.

A time "tR" (data transfer from cell to register) necessary to transfer data stored in the unit cell to the data I/O pad DQ in the read operation is approximately 25 µs. The time "tR" includes a time necessary to enable the page buffer to latch and buffer the data of the unit cell and output the buffered data. The timing when the page buffer enable signal PBDO for enabling the page buffer is activated is detected and the data input buffer 300 is disabled. Therefore, it is possible to prevent the data input buffer 300 from being unnecessarily enabled in the read operation. The data input controller 500 detects the transfer of the data corresponding to the command and the address from the core region to the data input buffer 300 and then disables the data input buffer 300. Consequently, the data input buffer of the flash memory device is enabled only when it receives data and transfers the received data, thereby reducing unnecessary power consumption of the data input buffer 300 in the read operation.

While the invention has been described with respect to the specific embodiments, it will be apparent to those skilled in the art that various changes and modifications may be made without departing from the spirit and scope of the invention as defined in the following claims.

What is claimed is:

1. A flash memory device, comprising:
   a data input/output pad;
   a core region including a plurality of unit cells;
   a data input buffer configured to receive a command and an address through the pad and to transfer the command and address to the core region;
   a data output buffer configured to output data corresponding to the command through the pad; and
   a data input controller configured to detect an outputting of data corresponding to the command and the address, and to disable the data input buffer.

2. The flash memory device of claim 1, wherein the data input controller detects the outputting of the data by using a page buffer enable signal of a page buffer for latching the data.

3. The flash memory device of claim 2, wherein the data input controller comprises:
   a data input timing detecting unit configured to generate a detection signal in response to the page buffer enable signal; and
   a data input enable signal generating unit configured to combine the detection signal with control signals activated in a standby mode to generate a data input enable signal for enabling the data input buffer.

4. The flash memory device of claim 3, wherein the data input timing detecting unit comprises:
   a first detecting unit configured to detect an enabling of the page buffer;
   a second detecting unit configured to detect an inputting of the address and an inputting of the command; and
   a third detecting unit configured to combine an output signal of the first detecting unit with an output signal of the second detecting unit to generate the detection signal for controlling the enable timing of the data input buffer.

5. A method for driving a flash memory device, comprising:
   receiving a command and an address through a data input/output pad and transferring the command and address;
   outputting data corresponding to the command through the data input/output pad; and
   detecting an outputting of the data corresponding to the command and the address, and disabling the data input buffer.

6. The method of claim 5, wherein the outputting of the data is detected by using a page buffer enable signal of a page buffer for latching the data.

7. A flash memory device, comprising:
   a data input/output pad;
   a data input buffer configured to receive a command and an address through the data input/output pad and to transfer the command and address to a core region; and
   a data input controller configured to detect an outputting of the data corresponding to the command and the address, and to disable the data input buffer.

8. The flash memory device of claim 7, wherein the data input controller detects the outputting of the data by using a page buffer enable signal of a page buffer for latching the data.

9. The flash memory device of claim 7, wherein the data input controller comprises:
   a data input timing detecting unit configured to generate a detection signal in response to the page buffer enable signal; and
   a data input enable signal generating unit configured to combine the detection signal with control signals activated in a standby mode, and to generate a data input enable signal for enabling the data input buffer.

10. The flash memory device of claim 9, wherein the data input timing detecting unit comprises:
    a first detecting unit configured to detect an enabling of the page buffer;
    a second detecting unit configured to detect an inputting of the address and an inputting of the command; and
    a third detecting unit configured to combine an output signal of the first detecting unit with an output signal of the second detecting unit to generate the detection signal for controlling the enable timing of the data input buffer.

11. A flash memory device, comprising:
    a data input buffer configured to receive a command and an address through a data input/output pad and transfer the command and address to a core region;
    a data output buffer configured to output data corresponding to the command through the data input/output pad; and
    a data input controller configured to generate a data input enable signal to enable the data input buffer in response to a timing control signal to disable the data input buffer by detecting an outputting of the data corresponding to the command and the address.

12. The flash memory device of claim 11, wherein the data input controller combines the timing control signal with control signals activated in a standby mode to generate the data input enable signal.

13. The flash memory device of claim 11, wherein the data input controller further comprises:
    a data input timing detecting unit configured to detect the outputting of the data by using a page buffer enable signal of a page buffer for latching the data to generate the timing control signal.

14. The flash memory device of claim 13, wherein the data input timing detecting unit comprises:
    a first detecting unit configured to detect an enabling of the page buffer;
    a second detecting unit configured to detect an inputting of the address and an inputting of the command; and
    a third detecting unit configured to combine an output signal of the first detecting unit with an output signal of the second detecting unit to generate the timing control signal for controlling the enable timing of the data input buffer.

15. The flash memory device of claim 11, further comprising:

an input timing controller configured to control setup/hold timing of data, address, and command outputted from the data input buffer and transfer the controlled setup/hold timing to the core region; and an electrostatic discharge (ESD) protector configured to protect the data input buffer and the input timing controller, from electrostatic discharge inputted through the data input/output pad.

* * * * *